(12) United States Patent
Liu

(10) Patent No.: US 11,264,510 B2
(45) Date of Patent: Mar. 1, 2022

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Fangmei Liu, Shenzhen (CN)

( * ) Notice: Subject to any disclaimer, the term of this patent is extended or adjusted under 35 U.S.C. 154(b) by 215 days.

(21) Appl. No.: 16/626,341

(22) PCT Filed: Nov. 8, 2019

(86) PCT No.: PCT/CN2019/116538
§ 371 (c)(1),
(2) Date: Dec. 24, 2019

(87) PCT Pub. No.: WO2021/077471
PCT Pub. Date: Apr. 29, 2021

(65) Prior Publication Data
US 2021/0336062 A1    Oct. 28, 2021

(30) Foreign Application Priority Data
Oct. 22, 2019    (CN) .......................... 201911003341.3

(51) Int. Cl.
*H01L 29/786*    (2006.01)
*H01L 21/02*    (2006.01)
(Continued)

(52) U.S. Cl.
CPC .. *H01L 29/78633* (2013.01); *H01L 21/02488* (2013.01); *H01L 21/02565* (2013.01); *H01L 29/66969* (2013.01); *H01L 29/7869* (2013.01); *H01L 29/78603* (2013.01); *H01L 27/3262* (2013.01)

(58) Field of Classification Search
CPC ......... H01L 21/02104; H01L 21/02436; H01L 21/02488; H01L 21/02518; H01L 21/02565; H01L 27/1214; H01L 27/1259; H01L 27/326; H01L 27/3262; H01L 27/3272; H01L 29/66007; H01L 29/66969; H01L 29/772; H01L 29/786; H01L 29/78603; H01L 29/78606;
(Continued)

(56) References Cited

U.S. PATENT DOCUMENTS 9,147,741 B2    9/2015   Na et al.
2019/0207038 A1*   7/2019   Sun .................... H01L 27/3274
(Continued)

FOREIGN PATENT DOCUMENTS

| CN | 107275390 A | 10/2017 |
| CN | 108198820 A | 6/2018 |
| CN | 109524475 A | 3/2019 |

*Primary Examiner* — Cheung Lee

(57) ABSTRACT

The present disclosure provides a thin film transistor and a manufacturing method thereof. The thin film transistor includes a substrate, a light shielding layer, an intermediate buffer layer, and a buffer layer, wherein the light shielding layer is formed on the substrate, the buffer layer is located above the substrate and the light shielding layer, the intermediate buffer layer is formed between the buffer layer and the light shielding layer, and the intermediate buffer layer is made of ceramic material.

15 Claims, 2 Drawing Sheets

(51) Int. Cl.
*H01L 29/66* (2006.01)
*H01L 27/32* (2006.01)

(58) Field of Classification Search
CPC ........... H01L 29/78633; H01L 29/7869; G02F 1/136209; G02F 1/1368
See application file for complete search history.

(56) References Cited

U.S. PATENT DOCUMENTS

2020/0161401 A1    5/2020  Liu
2020/0176612 A1    6/2020  Wang et al.
2020/0243566 A1*   7/2020  Liu ..................... H01L 27/1248

* cited by examiner

THIN FILM TRANSISTOR AND MANUFACTURING METHOD THEREOF

FIELD OF INVENTION

The present disclosure relates to a thin film transistor and a manufacturing method thereof, and in particular, relates to a thin film transistor adopting indium gallium zinc oxide and a manufacturing method thereof.

BACKGROUND OF INVENTION

At present, oxide thin film transistors (Oxide TFT) are widely used in integrated circuits (IC) and image display device driving circuits for excellent performance thereof. As a channel for realizing charge transfer between the source and the drain of a TFT device, a channel layer of the field effect transistor is an important structure of the TFT device, and the structure and performance of the channel layer directly affect the electrical properties of the device product. A semiconductor thin film material may be selected as the channel layer, and a silicon-based semiconductor material and an oxide semiconductor material are known. An example of an oxide semiconductor material, indium gallium zinc oxide (IGZO).

Generally, in the manufacturing process of a top-gate indium gallium zinc oxide thin film transistors (IGZO TFT), a light shielding (LS) layer has a two-layer structure of molybdenum (Mo), and copper (Cu), wherein an upper layer of the two-layer structure is copper, and the lower layer is molybdenum. However, some products, such as gate driver on array (GOA), require a light shielding layer used as a trace. In order to reduce the series resistance Rs, molybdenum and copper must be used as the light shielding layer as described above. A buffer layer of a conventional top-gate IGZO TFT is made of silicon oxide (SiOx). Plasma enhanced chemical vapor deposition (PECVD) is used to deposit SiOx directly on the copper film, and a reactive gas, such as nitrous oxide (N2O), is generated, so that the surface of the copper film on the upper layer of the two-layer structure is oxidized. In addition, the coverage of SiOx is poor, and undercuts easily occur.

As a result, it is necessary to provide a thin film transistor and a manufacturing method thereof to solve the defects existing in the conventional technology.

SUMMARY OF INVENTION

Technical Problem

An object of the present disclosure is to provide a thin film transistor and a manufacturing method thereof, wherein materials of an intermediate buffer layer and a buffer layer are different, and the intermediate buffer layer is the ceramic material, the intermediate buffer layer replaces silicon oxide with the ceramic material, which can avoid undercuts occurring to a silicon oxide single layer of the intermediate buffer layer.

Technical Solution

To achieve the above object, the present disclosure provides a thin film transistor, the thin film transistor includes a substrate, a light shielding layer, an intermediate buffer layer, and a buffer layer, wherein the light shielding layer is formed on the substrate, the buffer layer is located above the substrate and the light shielding layer, the intermediate buffer layer is formed between the buffer layer and the light shielding layer, and the intermediate buffer layer is made of ceramic material; the light shielding layer includes a two-layer structure, an upper layer of the two-layer structure is copper, and a lower layer of the two-layer structure is molybdenum.

In an embodiment of the present disclosure, the thin film transistor further includes an oxide semiconductor layer, a gate insulating layer, a gate metal layer, a doped semiconductor layer, an interlayer insulating layer, and a source-drain metal layer; the source-drain metal layer extends to the doped semiconductor layer through two first channels, and the source-drain metal layer extends to the light shielding layer through a second channel.

In an embodiment of the present disclosure, the ceramic material of the intermediate buffer layer is silicon nitride, and a thickness of the intermediate buffer layer ranges from 500 to 2000 Angstroms.

In an embodiment of the present disclosure, the material of the buffer layer is silicon oxide, and a thickness of the buffer layer ranges from 1000 to 3000 Angstroms.

In an embodiment of the present disclosure, the two first channels pass through the interlayer insulating layer, and the two first channels are respectively located on two opposite sides of the gate metal layer.

In an embodiment of the present disclosure, the second channel passes through the interlayer insulating layer, the buffer layer, and the intermediate buffer layer.

To achieve the above object, the present disclosure provides a manufacturing method of a thin film transistor, and the manufacturing method includes a light shielding layer forming step of depositing a light shielding layer on a substrate; an intermediate buffer layer forming step of forming an intermediate buffer layer on the substrate and the light shielding layer, wherein the intermediate buffer layer is a ceramic material; and a buffer layer forming step of forming a buffer layer on the intermediate buffer layer such that the intermediate buffer layer is located between the buffer layer and the light shielding layer.

In an embodiment of the present disclosure, in the intermediate buffer layer forming step, the ceramic material of the intermediate buffer layer is silicon nitride, and a thickness of the intermediate buffer layer ranges from 500 to 2000 Angstroms.

In an embodiment of the present disclosure, in the buffer layer forming step, the material of the buffer layer is silicon oxide, and a thickness of the buffer layer ranges from 1000 to 3000 Angstroms.

In an embodiment of the present disclosure, in the light shielding layer forming step, the light shielding layer includes a two-layer structure, and an upper layer of the two-layer structure is copper.

To achieve the above object, the present disclosure provides a thin film transistor, the thin film transistor includes a substrate, a light shielding layer, an intermediate buffer layer, and a buffer layer, wherein the light shielding layer is formed on the substrate, the buffer layer is located above the substrate and the light shielding layer, the intermediate buffer layer is formed between the buffer layer and the light shielding layer, and the intermediate buffer layer is made of ceramic material.

In an embodiment of the present disclosure, the thin film transistor further includes an oxide semiconductor layer, a gate insulating layer, a gate metal layer, a doped semiconductor layer, an interlayer insulating layer, and a source-drain metal layer; the source-drain metal layer extends to the doped semiconductor layer through two first channels, and the source-drain metal layer extends to the light shielding layer through a second channel.

In an embodiment of the present disclosure, the ceramic material of the intermediate buffer layer is silicon nitride, and a thickness of the intermediate buffer layer ranges from 500 to 2000 Angstroms.

In an embodiment of the present disclosure, the material of the buffer layer is silicon oxide, and a thickness of the buffer layer ranges from 1000 to 3000 Angstroms.

In an embodiment of the present disclosure, the two first channels pass through the interlayer insulating layer, and the two first channels are respectively located on two opposite sides of the gate metal layer.

In an embodiment of the present disclosure, the second channel passes through the interlayer insulating layer, the buffer layer, and the intermediate buffer layer.

Advantageous Effects of Invention

The present disclosure has the beneficial effects as follows: the materials of the intermediate buffer layer and the buffer layer are different, and the intermediate buffer layer is the ceramic material, wherein the intermediate buffer layer replaces silicon oxide, such as silicon nitride, with the ceramic material, which can avoid undercuts occurring to a silicon oxide single layer of the intermediate buffer layer, and improve the coverage of the intermediate buffer layer. Moreover, the diffusion of copper ions can be reduced, thereby reducing the chance of oxidation.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
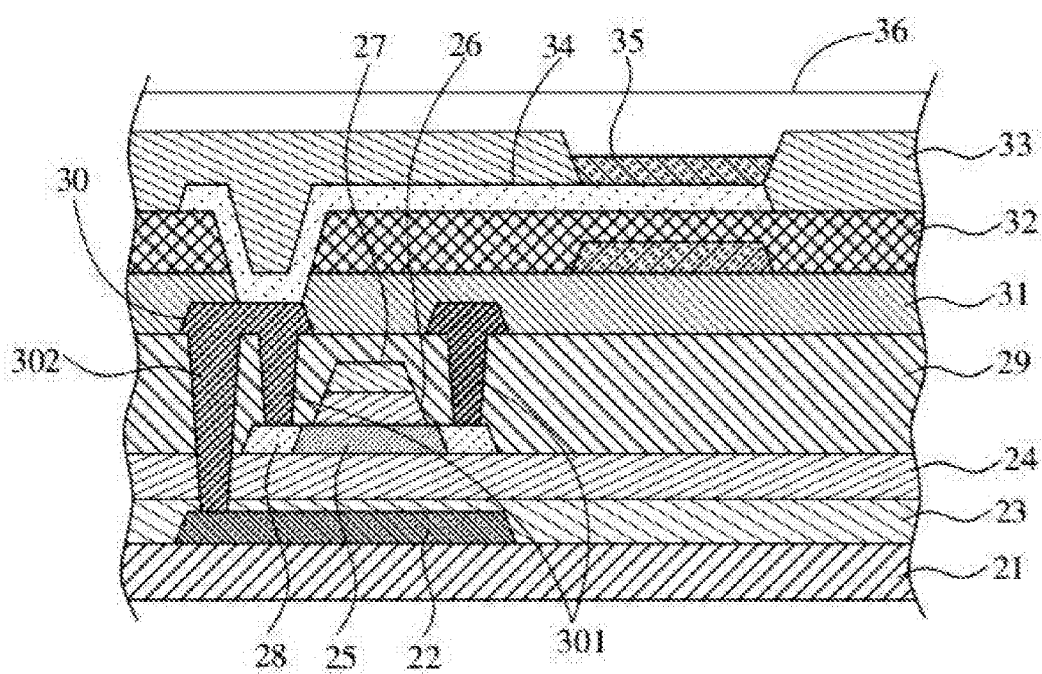
FIG. 1 is a schematic view of a thin film transistor according to a preferred embodiment of the present disclosure.

Referring to FIG. 1, a schematic view of a thin film transistor according to a preferred embodiment of the present disclosure is illustrated. The thin film transistor is a top-gate indium gallium zinc oxide (IGZO) thin film transistor. The thin film transistor includes a substrate 21, a light shielding layer 22, an intermediate buffer layer 23, a buffer layer 24, an oxide semiconductor layer 25, a gate insulating layer 26, a gate metal layer 27, a doped semiconductor layer 28, an interlayer insulating layer 29, a source-drain metal layer 30, and a passivation layer 31. The detailed structure of each component, assembly relationships, and principles of operation for the present invention will be described in detail hereinafter.

Referring to FIG. 1, the light shielding layer 22 is formed on the substrate 21, wherein the light shielding layer 22 includes a two-layer structure (not shown), an upper layer of the two-layer structure is copper, and a lower layer of the two-layer structure is molybdenum. The intermediate buffer layer 23 is formed on the substrate 21 and the light shielding layer 22, and the buffer layer 24 is formed on the intermediate buffer layer 23. Materials of the intermediate buffer layer 23 and the buffer layer 24 are different, and the intermediate buffer layer 23 is made of ceramic material. The oxide semiconductor layer 25 is formed on the buffer layer 24, wherein the oxide semiconductor layer 25 is patterned by light, and the material of the oxide semiconductor layer 25 is indium gallium zinc oxide.

In the embodiment, the ceramic material of the intermediate buffer layer 23 is silicon nitride, and the material of the buffer layer 24 is silicon oxide. A thickness of the intermediate buffer layer 23 is 500 to 2000 Angstroms, and a thickness of the buffer layer 24 is 1000 to 3000 Angstroms.

Referring to FIG. 1, the gate insulating layer 26 is formed on the oxide semiconductor layer 25, and the gate metal layer 27 is formed on the gate insulating layer 26, wherein the gate metal layer 27 and the gate insulating layer 26 are patterned by etching, and a part of the oxide semiconductor layer 25 is exposed. The exposed part of the oxide semiconductor layer 25 is formed by plasma processing to form the doped semiconductor layer 28.

Referring to FIG. 1, the interlayer insulating layer 29 is formed on the buffer layer 24, the doped semiconductor layer 28, and the gate metal layer 27. The source-drain metal layer 30 is formed on the interlayer insulating layer 29, wherein the source-drain metal layer 30 is connected to the doped semiconductor layer 28 and the light shielding layer 22. The passivation layer 31 is formed on the interlayer insulating layer 29 and the source-drain metal layer 30. In the embodiment, the source-drain metal layer 30 extends to the doped semiconductor layer 28 through two first channels 301, and the source-drain metal layer 30 extends to the light shielding layer 22 through a second channel 302. The first channels 301 pass through the interlayer insulating layer 29 and are respectively located near two opposite lateral sides of the gate metal layer 27.

Referring to FIG. 1, a planarization layer 32 is formed on the passivation layer 31, and a pixel definition layer 33 is formed on the planarization layer 32. An anode layer 34 and a light emitting layer 35 are formed on the pixel definition layer 33, and a cathode layer 36 is formed on the pixel definition layer 33 and the light emitting layer 35. In the embodiment, the light emitting layer 35 is an organic light emitting diode (OLED) light emitting layer.

As described above, the materials of the intermediate buffer layer 23 and the buffer layer 24 are different, and the intermediate buffer layer 23 is the ceramic material, wherein the intermediate buffer layer 23 replaces silicon oxide, such as silicon nitride, with the ceramic material, which can avoid undercuts of occurring to a silicon oxide single layer of the intermediate buffer layer 24, and improve the coverage of the intermediate buffer layer 24. Moreover, the diffusion of copper ions can be reduced, thereby reducing the chance of oxidation.

Figure 2:
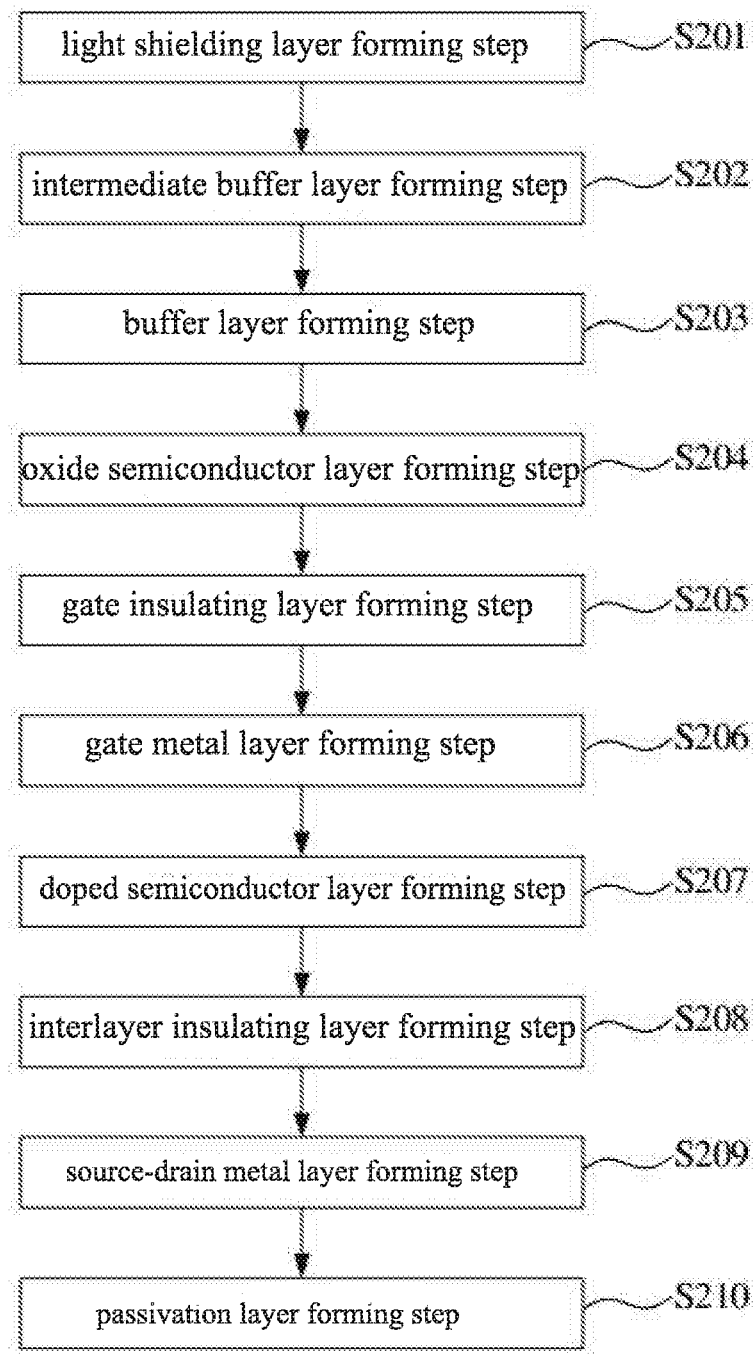
FIG. 2 is a flowchart of a manufacturing method of a thin film transistor according to a preferred embodiment of the present disclosure.

Referring to FIG. 2 with FIG. 1, a flowchart of a manufacturing method of a thin film transistor according to a preferred embodiment of the present disclosure is illustrated. The manufacturing method of the thin film transistor includes a light shielding layer forming step S201, an intermediate buffer layer forming step S202, a buffer layer forming step S203, an oxide semiconductor layer forming step S204, a gate insulating layer forming step S205, a gate metal layer forming step S206, a doped semiconductor layer forming step S207, an interlayer insulating layer forming step S208, a source-drain metal layer forming step S209, and a passivation layer forming step S210. The detailed step relationships, and principles of operation for the present disclosure is be described in detail hereinafter.

Referring to FIG. 2 with FIG. 1, in the light shielding layer forming step S201, a light shielding layer 22 is formed on the substrate 21, wherein the light shielding layer 22 includes a two-layer structure (not shown), an upper layer of the two-layer structure is copper, and a lower layer of the two-layer structure is molybdenum.

Referring to FIG. 2 with FIG. 1, in the intermediate buffer layer forming step S202, an intermediate buffer layer 23 is formed on the substrate 21 and the light shielding layer 22. In the embodiment, the ceramic material of the intermediate buffer layer 23 is silicon nitride, a thickness of the intermediate buffer layer 23 ranges from 500 to 2000 Angstroms.

Referring to FIG. 2 with FIG. 1, in the buffer layer forming step S203, a buffer layer is formed on the intermediate buffer layer 23, so that the intermediate buffer layer 23 is located between the buffer layer 24 and the light shielding layer 22. In the embodiment, the material of the buffer layer 24 is silicon oxide, and a thickness of the buffer layer 24 ranges from 1000 to 3000 Angstroms.

Referring to FIG. 2 with FIG. 1, in the oxide semiconductor layer forming step S204, an oxide semiconductor layer 25 is formed on the buffer layer 24, wherein the oxide semiconductor layer 25 is patterned by light, and the material of the oxide semiconductor layer 25 is indium gallium zinc oxide.

Referring to FIG. 2 with FIG. 1, in the gate insulating layer forming step S205, a gate insulating layer 26 is formed on the oxide semiconductor layer 25.

Referring to FIG. 2 with FIG. 1, in the gate metal layer forming step S206, a gate metal layer 27 is formed on the gate insulating layer 26, wherein the gate metal layer 27 and the gate insulating layer 26 are patterned by etching, and a part of the oxide semiconductor layer 25 is exposed.

Referring to FIG. 2 with FIG. 1, in the doped semiconductor layer forming step S207, the exposed part of the oxide semiconductor layer 25 is formed by plasma processing to form a doped semiconductor layer 28.

Referring to FIG. 2 with FIG. 1, in the interlayer insulating layer forming step S208, an interlayer insulating layer 29 is formed on the buffer layer 24, the doped semiconductor layer 28, and the gate metal layer 27. In the embodiment, the material of the interlayer insulating layer 29 is silicon oxide or silicon nitride.

Referring to FIG. 2 with FIG. 1, in the source-drain metal layer forming step S209, a source-drain metal layer 30 is formed on the interlayer insulating layer 29, wherein the source-drain metal layer 30 extends to the doped semiconductor layer 28 through two first channels 301, and the source-drain metal layer 30 extends to the light shielding layer 22 through a second channel 302. The first channels 301 pass through the interlayer insulating layer 29 and are respectively located on two opposite sides of the gate metal layer 27. The second channel 302 passes through the interlayer insulating layer 29, the intermediate buffer layer 23, and the buffer layer 24.

Referring to FIG. 2 with FIG. 1, in the passivation layer forming step S210, a passivation layer 31 is formed on the interlayer insulating layer 29 and the source-drain metal layer 30.

As described above, the materials of the intermediate buffer layer 23 and the buffer layer 24 are different, and the intermediate buffer layer 23 is the ceramic material, wherein the intermediate buffer layer 23 replaces silicon oxide, such as silicon nitride, with the ceramic material, which can avoid undercuts occurring to a silicon oxide single layer of the intermediate buffer layer 24, and improve the coverage of the intermediate buffer layer 24. Moreover, the diffusion of copper ions can be reduced, thereby reducing the chance of oxidation.

The above description is only a preferred embodiment of the present disclosure, and it should be noted that those skilled in the art can also make improvements and retouches without departing from the principles of the present invention. These improvements and retouches should also be considered as protection of the present disclosure.

What is claimed is:

1. A thin film transistor, comprising:
a substrate, a light shielding layer, an intermediate buffer layer, and a buffer layer;
wherein the light shielding layer is formed on the substrate, the buffer layer is located above the substrate and the light shielding layer, the intermediate buffer layer is formed between the buffer layer and the light shielding layer, and the intermediate buffer layer is made of ceramic material;
the light shielding layer includes a two-layer structure, an upper layer of the two-layer structure is copper, and a lower layer of the two-layer structure is molybdenum.

2. The thin film transistor according to claim 1, wherein the thin film transistor further includes an oxide semiconductor layer, a gate insulating layer, a gate metal layer, a doped semiconductor layer, an interlayer insulating layer, and a source-drain metal layer; the source-drain metal layer extends to the doped semiconductor layer through two first channels, and the source-drain metal layer extends to the light shielding layer through a second channel.

3. The thin film transistor according to claim 2, wherein the two first channels pass through the interlayer insulating layer, and the two first channels are respectively located on two opposite sides of the gate metal layer.

4. The thin film transistor according to claim 2, wherein the second channel passes through the interlayer insulating layer, the buffer layer, and the intermediate buffer layer.

5. The thin film transistor according to claim 1, wherein the ceramic material of the intermediate buffer layer is silicon nitride, and a thickness of the intermediate buffer layer ranges from 500 to 2000 Angstroms.

6. The thin film transistor according to claim 1, wherein the material of the buffer layer is silicon oxide, and a thickness of the buffer layer ranges from 1000 to 3000 Angstroms.

7. A manufacturing method of a thin film transistor, comprising steps of:
a light shielding layer forming step of depositing a light shielding layer on a substrate;
an intermediate buffer layer forming step of forming an intermediate buffer layer on the substrate and the light shielding layer, wherein the intermediate buffer layer is a ceramic material; and
a buffer layer forming step of forming a buffer layer on the intermediate buffer layer such that the intermediate buffer layer is located between the buffer layer and the light shielding layer,
wherein in the light shielding layer forming step, the light shielding layer includes a two-layer structure, and an upper layer of the two-layer structure is copper.

8. The manufacturing method according to claim 7, wherein in the intermediate buffer layer forming step, the ceramic material of the intermediate buffer layer is silicon nitride, and a thickness of the intermediate buffer layer ranges from 500 to 2000 Angstroms.

9. The manufacturing method according to claim 7, wherein in the buffer layer forming step, the material of the buffer layer is silicon oxide, and a thickness of the buffer layer ranges from 1000 to 3000 Angstroms.

10. A thin film transistor, comprising:
   a substrate, a light shielding layer, an intermediate buffer layer, and a buffer layer;
   wherein the light shielding layer is formed on the substrate, the buffer layer is located above the substrate and the light shielding layer, the intermediate buffer layer is formed between the buffer layer and the light shielding layer, and the intermediate buffer layer is made of ceramic material,
   wherein the light shielding layer includes a two-layer structure, and an upper layer of the two-layer structure is copper.

11. The thin film transistor according to claim 10, wherein the thin film transistor further includes an oxide semiconductor layer, a gate insulating layer, a gate metal layer, a doped semiconductor layer, an interlayer insulating layer, and a source-drain metal layer; the source-drain metal layer extends to the doped semiconductor layer through two first channels, and the source-drain metal layer extends to the light shielding layer through a second channel.

12. The thin film transistor according to claim 11, wherein the two first channels pass through the interlayer insulating layer, and the two first channels are respectively located on two opposite sides of the gate metal layer.

13. The thin film transistor according to claim 11, wherein the second channel passes through the interlayer insulating layer, the buffer layer, and the intermediate buffer layer.

14. The thin film transistor according to claim 10, wherein the ceramic material of the intermediate buffer layer is silicon nitride, and a thickness of the intermediate buffer layer ranges from 500 to 2000 Angstroms.

15. The thin film transistor according to claim 10, wherein the material of the buffer layer is silicon oxide, and a thickness of the buffer layer ranges from 1000 to 3000 Angstroms.

* * * * *